(12) United States Patent
Preusse et al.

(10) Patent No.: US 8,450,197 B2
(45) Date of Patent: May 28, 2013

(54) CONTACT ELEMENTS OF A SEMICONDUCTOR DEVICE FORMED BY ELECTROLESS PLATING AND EXCESS MATERIAL REMOVAL WITH REDUCED SHEER FORCES

(75) Inventors: Axel Preusse, Radebeul (DE); Norbert Schroeder, Dresden (DE); Uwe Stoeckgen, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 35 days.

(21) Appl. No.: 12/962,968

(22) Filed: Dec. 8, 2010

(65) Prior Publication Data
US 2011/0244679 A1    Oct. 6, 2011

(30) Foreign Application Priority Data
Mar. 31, 2010 (DE) .................... 10 2010 003 556

(51) Int. Cl.
H01L 21/20 (2006.01)
H01L 21/4763 (2006.01)
H01L 21/44 (2006.01)

(52) U.S. Cl.
USPC ........... 438/584; 438/625; 438/626; 438/641; 438/645; 438/672; 257/E21.583; 257/E21.586; 257/E21.577; 257/E21.171

(58) Field of Classification Search
USPC .................... 257/E21.583, E21.586, E21.577, 257/E21.171
See application file for complete search history.

(56) References Cited

U.S. PATENT DOCUMENTS

| | | | |
|---|---|---|---|
| 4,879,257 A | 11/1989 | Patrick | |
| 5,219,789 A * | 6/1993 | Adan | 438/645 |
| 5,484,747 A * | 1/1996 | Chien | 438/644 |
| 5,674,787 A | 10/1997 | Zhao et al. | |
| 6,174,813 B1 * | 1/2001 | Wang | 438/692 |
| 6,204,561 B1 * | 3/2001 | Yoshizawa | 257/751 |
| 6,214,728 B1 | 4/2001 | Chan et al. | |
| 6,713,780 B2 * | 3/2004 | Lam | 257/552 |
| 7,045,435 B1 * | 5/2006 | Liu | 438/427 |
| 7,972,921 B2 * | 7/2011 | Chong et al. | 438/221 |

(Continued)

FOREIGN PATENT DOCUMENTS

DE 10 2007 004 884 A1    8/2008
JP    04038832 A    2/1992

OTHER PUBLICATIONS

Seidle et al., English Machine Translated of DE Publication No. 102007004884 A1, Aug. 14, 2008 (Machine Translated Jun. 12, 2012).*

(Continued)

*Primary Examiner* — Mohsen Ahmadi
(74) *Attorney, Agent, or Firm* — Williams, Morgan & Amerson, P.C.

(57) ABSTRACT

Contact elements in the contact level of a semiconductor device may be formed on the basis of a selective deposition technique, such as electroless plating, wherein an efficient planarization of the contact level is achieved without subjecting the contact elements to undue mechanical stress. In some illustrative embodiments, an overfilling of the contact openings may be reliably avoided and the planarization of the surface topography is accomplished on the basis of a non-critical polishing process. In other cases, electrochemical etch techniques are applied in combination with a conductive sacrificial current distribution layer in order to remove any excess material of the contact elements without inducing undue mechanical stress.

11 Claims, 7 Drawing Sheets

U.S. PATENT DOCUMENTS

| | | | | |
|---|---|---|---|---|
| 8,129,276 B2* | 3/2012 | Richter et al. | ............... | 438/675 |
| 2008/0194099 A1* | 8/2008 | Angyal et al. | ............... | 438/643 |
| 2009/0140431 A1* | 6/2009 | Feustel et al. | ............... | 257/758 |
| 2009/0246932 A1* | 10/2009 | Kamioka et al. | ............... | 438/421 |
| 2010/0193963 A1* | 8/2010 | Richter et al. | ............... | 257/774 |

OTHER PUBLICATIONS

Translation of Official Communication from German Patent Application No. 10 2010 003 556.4 dated Nov. 4, 2010.

* cited by examiner

CONTACT ELEMENTS OF A SEMICONDUCTOR DEVICE FORMED BY ELECTROLESS PLATING AND EXCESS MATERIAL REMOVAL WITH REDUCED SHEER FORCES

BACKGROUND OF THE INVENTION

1. Field of the Invention

The present disclosure generally relates to the fabrication of integrated circuits, and, more particularly, to the contact level of a semiconductor device, in which contact areas, such as gate electrodes and drain and source regions, are connected to the metallization system of the semiconductor device by means of contact elements formed on the basis of electrochemical deposition techniques.

2. Description of the Related Art

In modern integrated circuits, such as microprocessors, storage devices and the like, a very high number of circuit elements, especially transistors, are provided on a restricted chip area. Although immense progress has been made over recent decades with respect to increased performance and reduced feature sizes of the circuit elements, the ongoing demand for enhanced functionality of electronic devices forces semiconductor manufacturers to steadily reduce the dimensions of the circuit elements and to increase the operating speed thereof. The continuing scaling of feature sizes, however, involves great efforts in redesigning process techniques and developing new process strategies and tools so as to comply with new design rules. Generally, in complex circuitry including complex logic portions, MOS technology is presently a preferred manufacturing technique in view of device performance and/or power consumption and/or cost efficiency. In integrated circuits including logic portions fabricated by MOS technology, many field effect transistors (FETs) are provided that are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain terminal and a source terminal.

On the basis of the field effect transistors, more complex circuit components may be composed, such as inverters and the like, thereby forming complex logic circuitry, memory devices and the like. Due to the reduced dimensions, the operating speed of the circuit components has been increased with every new device generation, wherein, however, the limiting factor of the finally achieved operating speed of complex integrated circuits is no longer the individual transistor elements but the electrical performance of the complex wiring network, which may be formed above the device level including the actual semiconductor-based circuit elements, such as transistors and the like. Typically, due to the large number of circuit elements and the required complex layout of modern integrated circuits, the electrical connections of the individual circuit elements cannot be established within the same device level on which the circuit elements are manufactured, but require one or more additional metallization layers, which generally include metal-containing lines providing the inner-level electrical connection, and also include a plurality of inter-level connections, which are also referred to as vias. These interconnect structures comprise an appropriate metal and provide the electrical connection of the individual circuit elements and of the various stacked metallization layers.

Furthermore, in order to establish a connection of the circuit elements with the metallization layers, an appropriate vertical contact structure is provided, which connects to a respective contact region of a circuit element, such as a gate electrode and/or the drain and source regions of transistors, and to a respective metal line in the metallization layer. The contact structure may comprise contact elements or contact plugs formed in an interlayer dielectric material that encloses and passivates the circuit elements. Upon shrinking the critical dimensions of the circuit elements in the device level, the dimensions of metal lines, vias and contact elements also have to be adapted to the reduced dimensions, thereby requiring sophisticated metal-containing materials and dielectric materials in order to reduce the parasitic capacitance in the metallization layers and provide sufficiently high conductivity of the individual metal lines and vias. For example, in complex metallization systems, copper in combination with low-k dielectric materials, which are to be understood as dielectric materials having a dielectric constant of approximately 3.0 or less, are typically used in order to achieve the required electrical performance and the electromigration behavior as is required in view of reliability of the integrated circuits. Consequently, in lower lying metallization levels, metal lines and vias having critical dimensions of approximately 100 nm and significantly less may have to be provided in order to achieve the required packing density in accordance with density of circuit elements in the device level.

Upon further reducing the dimensions of the circuit elements, for instance using critical dimensions of 50 nm and less, the contact elements in the contact level may have to be provided with appropriate critical dimensions in the same order of magnitude. The contact elements may typically represent plugs, trenches and the like which are formed of an appropriate metal or metal composition, wherein, in sophisticated semiconductor devices, tungsten in combination with appropriate barrier materials has proven to be a viable contact metal. When forming tungsten-based contact elements, typically, the interlayer dielectric material may be formed first and may be patterned so as to receive contact openings, which may extend through the interlayer dielectric material to the corresponding contact areas of the circuit elements. For this purpose, openings of very different depth may have to be formed in the interlayer dielectric material in order to connect to gate electrode structures or any other conductive lines formed above the semiconductor layer, while other contact openings have to be extended down to a semiconductor layer, i.e., any contact areas formed therein. In particular, in densely packed device regions, the lateral size of the drain and source areas and thus the available area for the contact regions may be 100 nm and less, thereby requiring extremely complex lithography and etch techniques in order to form the contact openings with well-defined lateral dimensions and with a high degree of alignment accuracy, while the difference in etch depth may additionally contribute to the overall complexity of the patterning process. After exposing the contact areas, frequently provided in the form of metal silicide regions, a barrier material has to be provided, for instance in the form of a material system including titanium and titanium nitride, wherein the titanium material may provide the required adhesion characteristics, while the titanium nitride material may preserve integrity of the interlayer dielectric material during the subsequent deposition of the tungsten material, which may be accomplished on the basis of sophisticated chemical vapor deposition (CVD) techniques in which a direct contact between silicon dioxide-based materials and the deposition ambient for depositing the tungsten material is to be avoided. Typically, the actual deposition of the tungsten material may be preceded by the deposition of a nucleation layer based on tungsten, which may be accomplished by a dedicated deposition step, after which the actual fill material may be provided. After the deposition of these materials, any excess material is removed by chemical mechanical polishing (CMP), thereby forming the insulated contact elements in the interlayer dielectric material. Although the process sequence for patterning the contact openings and filling these openings with barrier materials and tungsten results in contact elements having a desired contact resistivity for semiconductor devices with critical dimensions of 50 nm, a further reduction of the size of the transistors may result in an increased contact resistivity, which may no longer be compatible with the device requirements. That is, upon further device scaling, the increased contact resistivity, which may result from conventional tungsten-based contact regimes, may represent a limiting factor of the operating speed of the integrated circuits, thereby at least partially offsetting many advantages obtained by the further reduction of the critical dimensions in the device level.

One of the reasons for the inferior contact resistivity in tungsten-based contact technologies is the requirement for barrier materials, possibly in combination with a nucleation layer, which may have an increased resistivity compared to the subsequent tungsten fill material. Since a thickness of the barrier materials and the nucleation layer may not be arbitrarily reduced without jeopardizing the effect of this material system, the amount of less conductive materials relative to the tungsten material may thus increase, thereby over-proportionally contributing to an increased contact resistance. For these reasons, it has been suggested to use other materials or deposition regimes in which the presence of a barrier material of reduced conductivity can be avoided. For example, it has been proposed to use wet chemical deposition techniques, such as the electrochemical deposition in the form of an electroless plating process in order to fill in an appropriate metal material, thereby obtaining a superior fill behavior in order to avoid the creation of any voids or other deposition-related irregularities, which may frequently be observed in complex CVD-based techniques in which a complex material system may have to be deposited within sophisticated contact openings, in particular when these openings may have very different depths. Although the electroless deposition technique may be very advantageous with respect to the gap-filling capability and the selection of an appropriate contact material, thereby providing the possibility of avoiding any barrier materials, it turns out that the selective material growth generates in a non-continuous layer of excess metal, which in turn may result in significant contact failures, as will be described with reference to FIGS. 1a-1c in more detail.

FIG. 1a schematically illustrates a cross-sectional view of a semiconductor device 100 comprising a substrate 101 and a semiconductor layer 102. The semiconductor layer 102 may comprise any appropriate semiconductor material, such as silicon, silicon/germanium and the like, as is required for forming therein and thereabove circuit elements 150, for instance in the form of transistors, which, in the example shown in FIG. 1a, are illustrated as planar field effect transistors. It should be appreciated that the substrate 101 and the semiconductor layer 102 may represent a silicon- or semiconductor-on-insulator (SOI) configuration, when a buried insulating material (not shown) is provided between the semiconductor layer 102 and the substrate 101. In other cases, the semiconductor material of the layer 102 may directly connect to a crystalline semiconductor material of the substrate 101, thereby forming a bulk configuration. The semiconductor layer 102 comprises a plurality of semiconductor regions or active regions 102A, 120B, 102C, which may be individually laterally delineated by isolation structures (not shown) or which may represent continuous semiconductor regions, depending on device requirements. The active regions 102A, 102B, 102C are to be understood as semiconductor regions in which appropriate dopant profiles are established as required for the various circuit elements, such as the transistors 150. For example, drain and source regions 151 may be provided with an appropriate vertical and lateral dopant profile in accordance with the required electronic characteristics of the transistors 150. Furthermore, the drain and source regions 151 may have areas of superior conductivity, for instance provided in the form of a metal silicide, such as nickel silicide, indicated by 154, which may at least partially act as a contact area for connecting to contact elements to be formed in a later manufacturing stage. Furthermore, the circuit elements 150, for instance in the form of field effect transistors, may also comprise certain components formed above the semiconductor layer 102, for instance in the form of a gate electrode structure 152, which may control the current flow in the transistors 150 upon applying an appropriate control voltage. The gate electrode structures 152 may have any appropriate configuration, that is, they may comprise appropriate gate dielectric materials, for instance in the form of silicon dioxide, silicon oxynitride, high-k dielectric materials, which are to be understood as dielectric materials having a dielectric constant of 10.0 and higher, and the like. Moreover, appropriate electrode material or materials may be provided, for instance in the form of doped semiconductor materials, metal-containing materials, such as a metal silicide, electrode metals and the like.

Moreover, in the manufacturing stage shown in FIG. 1a, a contact level 120 is provided in an intermediate manufacturing stage. The contact level 120 is to be understood as a device level of the semiconductor device 100 which provides for an appropriate isolation and passivation of the circuit elements 150 formed in and above the semiconductor layer 102, while at the same time electrically connecting the circuit elements 150 to a metallization system (not shown) that is to be formed above the contact level 120 and which may comprise metal features provided in a plurality of metallization layers in order to form the complex interconnect structure as required by the circuit layout of the device 100. The contact level 120 comprises one or more appropriate dielectric materials, such as a dielectric layer 121, for instance in the form of a silicon nitride material, a nitrogen-enriched silicon carbide material and the like, in combination with a silicon dioxide layer 122, as these materials represent well-established dielectric materials for the contact level of the semiconductor device 100. Moreover, the contact level 120 is illustrated in the manufacturing stage in which contact openings 123A, 123B are provided so as to extend to the semiconductor layer 102, i.e., to any contact areas formed therein, such as the metal silicide regions 154. It should be appreciated that other contact openings (not shown) may extend to the gate electrode structures 152, while, in other cases, any such contact elements extending to different gate levels within the semiconductor device 100 may be formed prior to or after providing the contact openings 123A, 123B.

The semiconductor device 100 as illustrated in FIG. 1a may be formed on the basis of the following process strategies. The active regions 102A, 102B, 102C may be provided upon forming appropriate isolation structures (not shown), which may be accomplished by using sophisticated lithography, patterning, deposition and planarization techniques in order to form trenches in the semiconductor layer 102 so as to extend down to a desired depth and refilling the trenches with an appropriate dielectric material. Prior to or after forming the isolation structures, dopant species may be introduced into the active regions 102A, 102B, 102C as required for adjusting the basic electronic characteristics of the circuit elements 150. Next, the gate electrode structures 152 are formed by applying any appropriate process strategy, depending on the desired configuration of the gate electrode structures 152. For example, appropriate gate dielectric materials may be formed, followed by the deposition of an electrode material, which may then be patterned on the basis of sophisticated lithography and etch techniques. Thereafter, the drain and source regions 151 may be formed, for instance by ion implantation and the like, and after any anneal processes, the metal silicide regions 154 may be provided by applying well-established silicidation techniques. Depending on the overall process strategy, metal silicide regions may also be formed in the gate electrode structures 152, if required. Next, the dielectric materials 121, 122 may be formed, for instance, by plasma enhanced CVD techniques, sub-atmospheric CVD, high density plasma CVD and the like. If required, a planarization of the material 122 may be performed, for instance by using well established CMP techniques, in which well-established process recipes may be applied for removing a portion of the material 122, for instance a silicon dioxide material, thereby obtaining a substantially planar surface topography of the contact level 120. Next, a lithography process may be applied, for instance on the basis of hard mask materials, if required, in order to provide an etch mask (not shown) which defines the lateral position and size of the contact openings 123A, 123B. Next, a complex etch sequence may be applied so as to etch through the dielectric materials 122, 121, thereby finally exposing a portion of the metal silicide regions 154, which may thus act as contact areas.

As previously discussed, the lateral dimensions of the contact openings 123A, 123B, at least in one dimension, i.e., in the horizontal direction of FIG. 1a, may have to be adapted to the reduced lateral dimensions of the circuit elements 150, which may represent transistors formed on the basis of critical dimensions of 50 nm and less, if, for instance, the length of the gate electrode structures 152 is considered. Thus, the contact openings 123A, 123B also have to be formed on the basis of similar critical dimensions, which may increasingly result in reduced device performance caused by an increased contact resistivity when using well-established process strategies based on tungsten and CVD deposition techniques, as indicated above. Consequently, new materials and deposition strategies for the contact level 120 have been proposed in order to avoid the deposition of complex barrier materials and seed materials, as is typically associated with CVD-based tungsten deposition regimes. Therefore, selective deposition techniques have been developed in which appropriate materials may be directly formed on the contact areas 154, without requiring additional barrier and seed materials on the sidewalls of the contact openings 123A, 123B. For example, electroless plating is an electrochemical deposition technique in which an appropriate electrolyte solution is provided, which comprises a reducing agent in combination with a salt including the desired metal component in addition with other chemical agents. Consequently, the deposition of the metal may be achieved on an appropriate surface, such as the contact area 154, which thus acts as a catalyst material, thereby avoiding the application of an external electrical power and also the application of additional seed materials. Consequently, during the deposition process, the metal material is increasingly growing on the contact areas 154 on the basis of an autocatalytic reaction, wherein, during the further advance of the process, the appropriate reducing agent provides for the deposition of the contact metal on the previously deposited contact metal. Consequently, a superior growth behavior from bottom to top may be accomplished on the basis of the electroless deposition process, thereby avoiding any irregularities, such as voids and seams, which may thus result in superior uniformity of the contact metal. Due to the lack of any additional barrier and seed materials, a superior conductivity of the contact elements may be obtained, even if the specific resistivity of the contact metal may be somewhat higher compared to, for instance, a pure tungsten material. For example, cobalt may be efficiently deposited directly on metal silicide regions, such as the contact areas 154, thereby obtaining contact elements of superior conductivity, even though cobalt has a higher specific resistivity compared to tungsten.

FIG. 1b schematically illustrates the semiconductor device 100 in a further advanced manufacturing stage. As illustrated, contact elements 123 are formed in the contact openings 123A, 123B on the basis of an electroless plating process, wherein the selective growth behavior and the requirement for providing a certain degree of overgrowth in view of compensating for process and device non-uniformities, such as contact openings of different depth, different growth rates caused by different local growth conditions, which may be correlated with a different density of contact openings, and the like, may result in a "mushroom" like configuration of the contact elements 123. In other words, the conductive contact metal may extend above the dielectric material of the contact level 120, and may laterally extend along a portion of the contact level, however, without forming a continuous metal layer across the entire surface of the contact level 120. The non-continuous configuration of the excess material of the contact elements 123, however, may significantly influence the further processing of the device 100 when applying well-established CMP techniques for removing any excess metal from the contact level 120.

FIG. 1c schematically illustrates a cross-sectional view of a portion of the semiconductor device 100 when performing a CMP process 103 in order to remove any excess material of the contact elements 123. For convenience, a single contact element 123 is illustrated during the polishing process 103, wherein, due to the "mushroom" like shape of the element 123, significant forces, as indicated by 103F, act on the contact element 123. For example, significantly increased sheer forces may result in corresponding torque forces, which in turn may result in a significant displacement of the contact element 123, as indicated by the dashed line. Consequently, significant contact failures may be created during the CMP process 103, which may result in an unacceptable increase of yield losses. For these reasons, currently great efforts are being made in identifying appropriate process parameters for the CMP process 103, for instance in terms of down force, slurry material and the like, in order to reduce the number of contact failures, which may be caused on the basis of CMP recipes that are typically applied in tungsten deposition regimes, in which a continuous tungsten layer is formed on the contact level 120.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides manufacturing techniques in which contact elements of a semiconductor device may be formed on the basis of selective deposition techniques, such as electroless plating, wherein any undue mechanical stress during the planarization of the contact level after the deposition of the contact metal may be avoided. To this end, in some illustrative embodiments, the contact metal may be appropriately embedded in an appropriate material, such as the dielectric material of the contact level, possibly in combination with additional sacrificial materials, so as to enable the planarization of the contact level without applying undue mechanical stress to the contact metal. For example, by appropriately selecting the initial thickness of the dielectric material of the contact level, any overfilling of the contact openings may be avoided, so that the planarization of the contact level may be accomplished on the basis of an etch process and/or a polishing process in which any excess material of the contact level may be removed without mechanically stressing the contact metal. In other illustrative embodiments disclosed herein, the planarization of the contact level may be accomplished by removing any excess material of the contact metal on the basis of an electrochemical etch process, thereby also efficiently avoiding any undue mechanical stress for the contact elements. Consequently, selective deposition techniques, such as electroless plating, may be efficiently applied for depositing the contact metal with superior uniformity, while undue contact failures may be avoided during planarization of the contact level.

One illustrative method disclosed herein relates to forming a contact element in a semiconductor device. The method comprises forming a metal in a contact opening formed in a dielectric material of a contact level by performing a selective deposition process, wherein the contact opening connects to a contact area of a circuit element that is formed at least partially in a semiconductor layer of the semiconductor device. The method further comprises forming a contact element from the metal so as to be laterally embedded. Additionally, the method comprises performing a planarization process on the basis of the laterally embedded contact element so as to provide a subsequent planar surface topography of the contact level.

A further illustrative method disclosed herein comprises forming a contact opening in a dielectric material of a contact level of a semiconductor device. Moreover, the method comprises forming a conductive material selectively within the contact opening without overfilling the contact opening. Additionally, the method comprises removing a portion of the dielectric material so as to provide a planar surface topography of the contact level.

A still further illustrative method disclosed herein comprises forming a contact opening in a dielectric material of a contact level of a semiconductor device, wherein the contact opening extends to a contact area of a circuit element. The method further comprises performing a selective deposition process so as to fill the contact opening with a conductive material. Moreover, the method comprises forming a sacrificial material layer above the dielectric material and the conductive material. Additionally, the method comprises planarizing a surface topography of the contact level by performing an etch process that is initiated in the presence of the sacrificial material layer.

BRIEF DESCRIPTION OF THE DRAWINGS

The disclosure may be understood by reference to the following description taken in conjunction with the accompanying drawings, in which like reference numerals identify like elements, and in which.

Figure 1A:
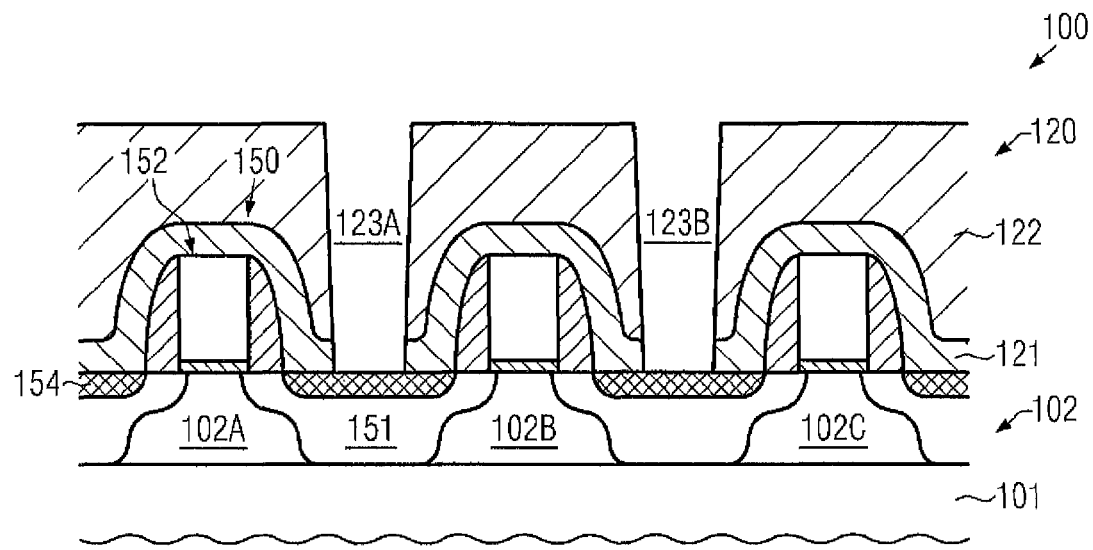
FIGS. 1a-1c schematically illustrate cross-sectional views of a semiconductor device during various manufacturing stages in forming contact elements on the basis of an electroless plating process and a conventional CMP process for removing any excess material of the contact elements.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides manufacturing strategies in which contact elements of a semiconductor device may be formed in the dielectric material of the contact level by applying selective deposition techniques, such as electroless plating and the like, while the planarization of the contact level may be accomplished without exerting undue mechanical stress to the contact elements. To this end, in some illustrative embodiments disclosed herein, the initial dielectric material of the contact level may be provided with excess height such that the contact metal may be filled into the contact openings, while reliably avoiding any overfilling of the contact openings. Consequently, the subsequent planarization of the contact level may be performed on the basis of any appropriate material removal process, in which, in some illustrative embodiments, only one dielectric material has to be removed, for instance on the basis of a CMP process, while at the same time the contact metal is laterally embedded in the dielectric material. In other illustrative embodiments, additionally to the lateral embedding of the contact elements in the initial dielectric material of the contact level, a sacrificial fill material, for instance in the form of a planarization material, may be applied and may be used during the planarization of the contact level, thereby providing an even further increased confinement of the contact elements. The sacrificial fill material and the excess material of the dielectric material of the contact level may be removed by using an etch process or a polishing process or a combination thereof.

In still other illustrative embodiments disclosed herein, the contact metal may be deposited on the basis of process parameters which may result in a certain degree of overfilling, while efficient embedding of the contact metal may be accomplished by providing a sacrificial planarization or fill material. Thereafter, an appropriate planarization process may be performed in the presence of the sacrificial material, which may then also be efficiently removed during the planarization process. The planarization process may comprise an etch process, a polishing process or a combination thereof, wherein the sacrificial material may reduce any lateral sheer forces when applying a polishing process.

In still other illustrative embodiments disclosed herein, the contact metal may be embedded on the basis of a conductive material, such as a metal material, which may be deposited after providing the actual contact metal on the basis of any appropriate deposition technique so as to provide a continuous conductive layer on the dielectric material of the contact level. Based on the continuous conductive layer, an electrochemical etch process may be applied in order to removal any excess material of the contact elements, thereby providing a substantially planar surface topography of the contact level. In some illustrative embodiments, the electrochemical etch process may be performed on the basis of an additional sacrificial material, which may result in superior process conditions, for instance, by covering a portion of the conductive layer at an initial phase of the electrochemical etch process.

Consequently, the concept of providing the contact metal on the basis of a selective deposition technique, such as an electroless plating process, may be efficiently applied with a high degree of flexibility, for instance with respect to the degree of overfilling of any contact openings and the like, since the planarization of the contact level may be performed on the basis of process strategies in which undue mechanical stresses, for instance caused by conventional CMP strategies, may be avoided.

Figure 1B:
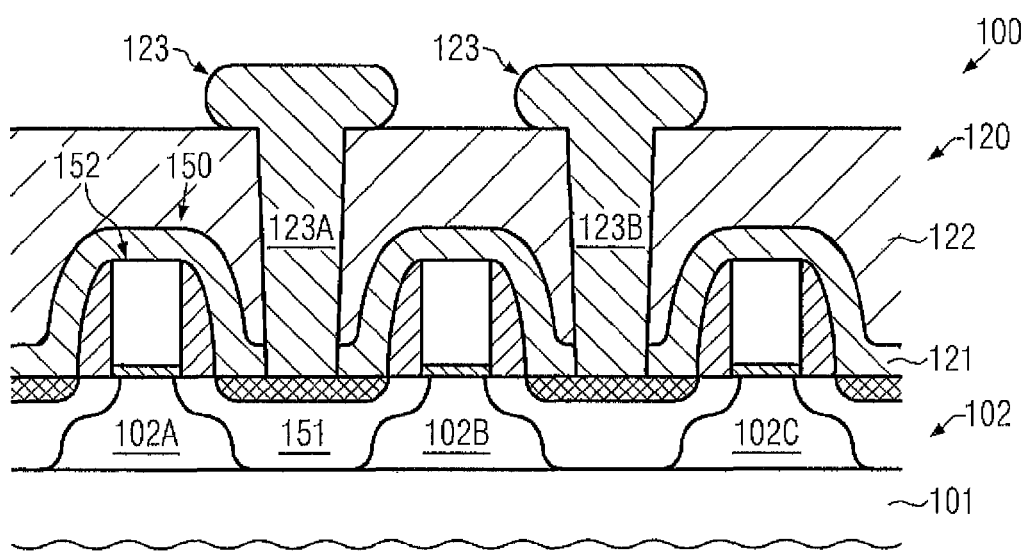
Figure 1C:
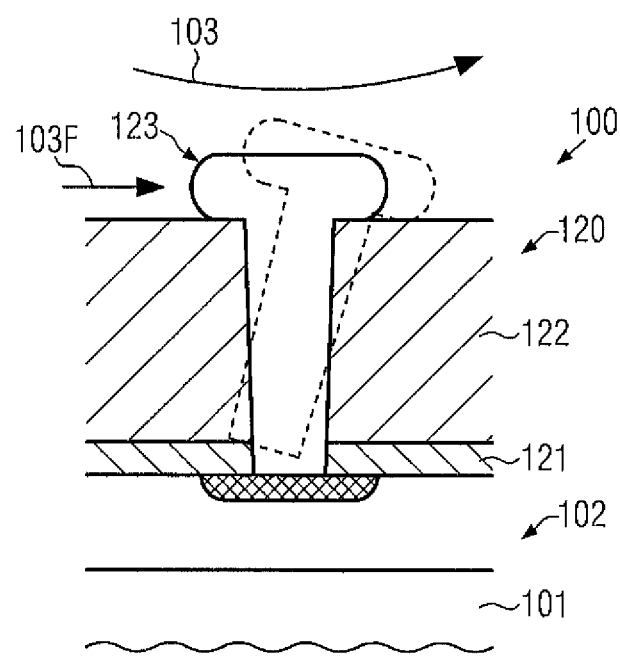

With reference to FIGS. 2a-2k, further illustrative embodiments will now be described in more detail, wherein reference is also made to FIGS. 1a-1c as required.

Figure 2A:
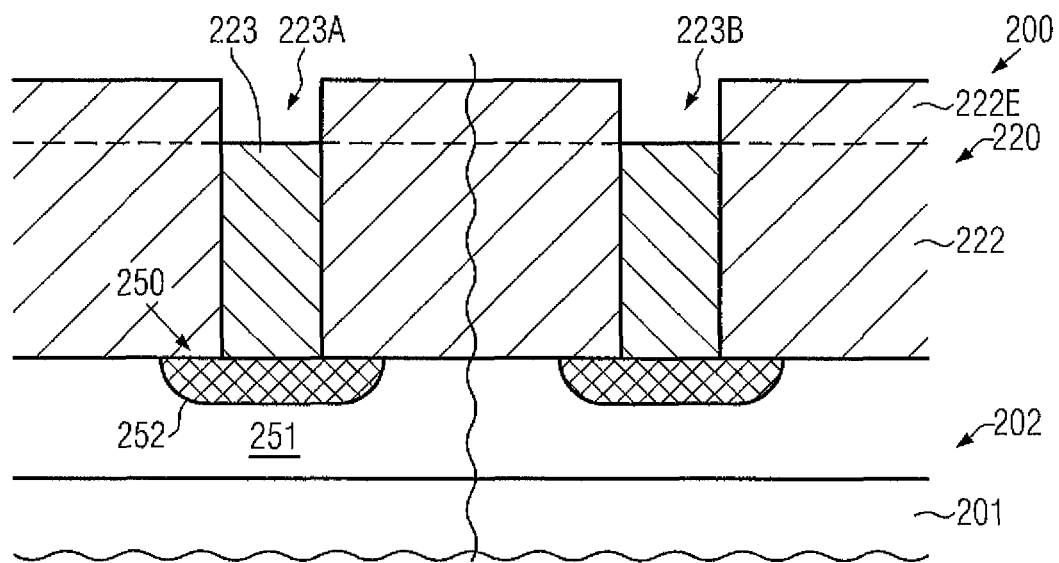
FIGS. 2a-2c schematically illustrate cross-sectional views of a semiconductor device in various manufacturing stages for forming contact elements on the basis of a selective deposition technique, wherein the planarization of the contact level may be accomplished without exerting undue mechanical stress to the contact elements by laterally embedding the contact metal in the dielectric material of the contact level, according to illustrative embodiments.

FIG. 2a schematically illustrates a cross-sectional view of a semiconductor device 200 comprising a substrate 201 in combination with a semiconductor layer 202, in and above which semiconductor-based circuit elements 250 may be provided. As explained before with reference to the semiconductor device 100, the substrate 201 and the semiconductor layer 202 may have any appropriate configuration, such as an SOI configuration, a bulk configuration and the like. Furthermore, the circuit elements 250 may represent any circuit elements formed on the basis of a semiconductor material of the semiconductor layer 202, such as field effect transistors, resistors, capacitors and the like, wherein at least some components may be formed in the semiconductor layer 202. For example, a doped region 251, for instance such as a drain or source region of a field effect transistor, may be provided in the semiconductor layer 202 and may represent a part of the circuit element 250. Moreover, a contact area 252, such as a metal silicide material, may be provided in the semiconductor layer 202 as a part of the circuit element 250. It should be appreciated that any criteria discussed above with reference to the semiconductor device 100 and the corresponding circuit element 150 may also apply for the circuit elements 250. It should further be noted that the circuit element 250 may also comprise any components, such as gate electrode structures and the like, which may be formed above the semiconductor layer 202 and which may require appropriately adapted contact elements, as is also discussed above.

Moreover, the semiconductor device 200 may comprise a contact level 220, which is to be understood as a dielectric material 222, which may include two or more individual material layers, depending on the overall requirements and configuration of the contact level 220. As also previously discussed with reference to the semiconductor device 100, the contact level 220 and thus the dielectric material 222 may be formed above and laterally adjacent to any semiconductor-based circuit elements, thereby providing the desired passivation of the circuit elements 250. For convenience, the dielectric material 222 is illustrated as representing a continuous material system, while, as is, for instance, explained above with reference to the semiconductor device 100, two or more individual layers, such as an etch stop layer and the like, may be provided, as required for the patterning of the contact level 220. In some cases, the dielectric material 222 or at least a portion thereof may be provided with a high internal stress level so as to increase performance of certain circuit elements, such as transistors and the like, when the stress level in the contact level 220 may provide superior charge carrier mobility in an associated portion of the semiconductor layer 202. In the embodiment shown in FIG. 2a and in the corresponding manufacturing stage, the contact level 220 is illustrated such that the dielectric material 222 may comprise an extra portion 222E which may represent a sacrificial material portion of the contact level 220 to be removed in a later manufacturing stage. Furthermore, contact elements 223 are provided in the contact level 220 so as to connect to the contact areas 252 provided in the semiconductor layer 202, while, in other cases, in addition to the contact elements 223, any other contact elements may be provided, which may connect to other circuit components formed above the semiconductor layer 202, such as gate electrode structures and the like, as is also previously explained. The contact elements 223 may represent a conductive material formed in corresponding contact openings 223A, 223B so as to extend to a desired height level without overfilling the contact openings 223A, 223B. The conductive material of the contact elements 223 may, in some illustrative embodiments, represent a substantially uniform material, thereby providing superior conductivity and thus contact resistivity of the contact level 220. In this case, additional barrier materials and the like may not be provided in the contact elements 223. To this end, any appropriate conductive materials, such as cobalt, or any other appropriate metals, such as aluminum and the like, may be provided.

The semiconductor device 200 as illustrated in FIG. 2a may be formed on the basis of the following processes. After completing the circuit elements 250 in and above the semiconductor layer 202, which may be accomplished by using process techniques as also previously discussed with reference to the semiconductor device 100, the dielectric material or materials of the contact level 220 may be deposited, wherein, contrary to the conventional strategies previously described, the sacrificial portion 222E may be provided, for instance by increasing the thickness of the final material layer of the contact level 220 or by providing a separate material layer, wherein a thickness of the extra portion 222E is selected such that a conductive material may be reliably confined within the contact openings 223A, 223B after patterning the same on the basis of any appropriate patterning regime. That is, the initial total height of the contact level 220 is selected such that the selective deposition of the conductive material of the contact elements 223 may not result in an overfilling of the contact openings 223A, 223B, irrespective of any process-related variations or irrespective of any difference in depth of contact openings, when any contact openings may have to be formed so as to extend to a lower depth, for instance when connecting to gate electrode structures and the like. After patterning the contact openings 223A, 223B, a selective deposition process, such as an electroless plating process, may be performed, wherein the exposed portion of the contact areas 252 may act as a catalyst material, thereby avoiding a separate provision of a catalyst material on the contact areas 252. For example, metals such as cobalt may be directly formed on a metal silicide on the basis of well-established electrochemical deposition recipes. Consequently, during the deposition of the conductive material of the circuit elements 223, a desired superior bottom-to-top fill behavior may be accomplished while avoiding or at least reducing any deposition-related irregularities as may typically occur in CVD-based techniques, when contact openings of reduced lateral dimensions are to be filled. Moreover, during the selective deposition, the process time may be appropriately controlled so as to achieve a desired fill height in any of the contact openings 223A, 223B, irrespective of the initial depth of the contact openings. On the other hand, the contact openings 223A, 223B may have an appropriate depth, due to the extra portion 222E, so as to avoid any overfilling of the contact openings within the desired deposition time. It should be appreciated that the deposition rate may be readily determined in advance, for instance on the basis of experiments, thereby enabling a reliable estimation of a required process time in order to obtain a fill height within any of the contact openings 223A, 223B that corresponds to a desired height of the contact elements 223.

Figure 2B:
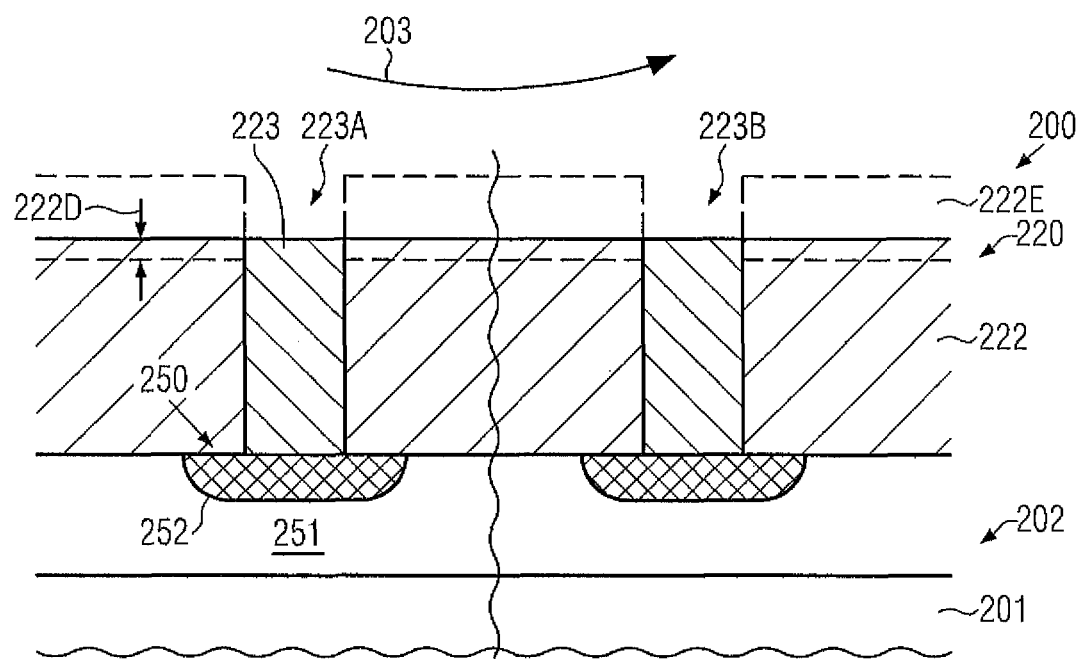

FIG. 2b schematically illustrates the semiconductor device 200 when performing a planarization process 203 in order to provide a planar surface topography for the contact level 220. In some illustrative embodiments, the planarization process 203 may be performed on the basis of a CMP process, in which mainly material of the contact level 220, i.e., the excess or sacrificial material portion 222E, may be removed. To this end, a plurality of well-established CMP recipes are available, wherein the material removal may be accomplished without unduly affecting the contact elements 223, since these elements are efficiently embedded in the contact level 220. For example, well-established CMP techniques for removing silicon dioxide material may be applied, when providing the materials 222 and 222E in the form of a silicon dioxide material. Consequently, during the planarization process 203, a single material has to be removed at least during most of the removal process 203, thereby finally exposing a top surface of the contact elements 223. In some illustrative embodiments, the planarization process 203 performed on the basis of a CMP process may be continued so as to remove a certain portion of the material 222, as indicated by 222D, in order to compensate for certain differences in height level of the contact elements 223 within the contact openings 223A, 223B. The corresponding removal of a portion of the contact level may be accomplished by a certain degree of over-polishing, wherein a corresponding material loss may be taken into consideration by appropriately adjusting the initial height or thickness of the contact level 220. It should be appreciated that also during the final phase of the planarization process 203, any significant sheer forces with respect to the contact elements 223 may be avoided, since the contact elements 223 may still be laterally embedded in the dielectric material 222 of the contact level 220.

Figure 2C:
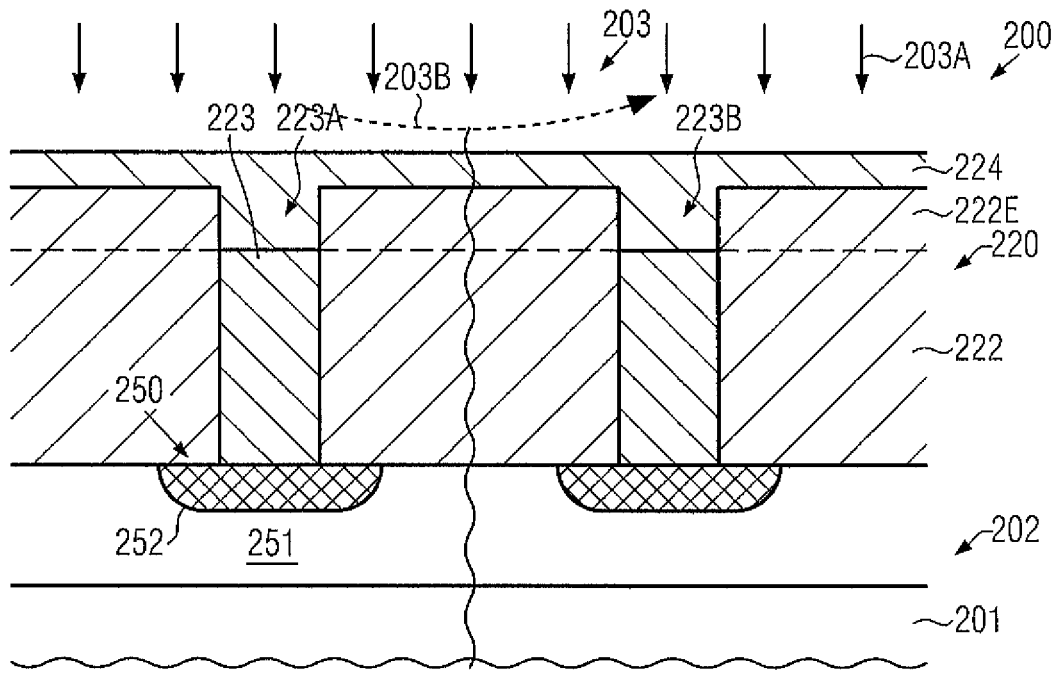

FIG. 2c schematically illustrates the semiconductor device 200 according to further illustrative embodiments in which an additional sacrificial material 224 may be provided above the contact level 220 prior to performing the planarization process 203. For this purpose, the sacrificial material 224 may be provided in the form of a planarization material, i.e., a material that may be applied on the basis of spin-on techniques and the like, thereby providing a superior planar surface topography, for instance by completely filling the contact openings 223A, 223B. To this end, a plurality of polymer materials are available, which may be applied in a low viscous state and which may then be hardened, thereby providing a substantially planar surface topography. In some illustrative embodiments, the planarization process 203 may be performed on the basis of an etch process 203A, in which the material 224, and during the further advance of the etch process 203A also the material 222E, may be removed, without unduly exposing the contact elements 223 to the reactive process ambient of the process 203A. For example, the material 224 may have a similar etch behavior as the material 222E, thereby resulting in a superior surface topography. In other cases, the planarization process 203 may comprise a polishing process 203B, in which the material 224 and finally the material 222E may be efficiently removed, while providing superior integrity of the contact elements 223, which may be exposed at a final phase of the polishing process 203B only, thereby avoiding undue interaction of the process ambient of the process 203B and the contact elements 223. In other illustrative embodiments, the planarization process 203 may be performed on the basis of both the process 203A and 203B, for instance by first etching the materials 224, 222E and subsequently applying the polishing process 203B, during which a difference in height level of the contact elements 223 may be reduced, as is for instance previously described with reference to FIG. 2b.

Figure 2D:
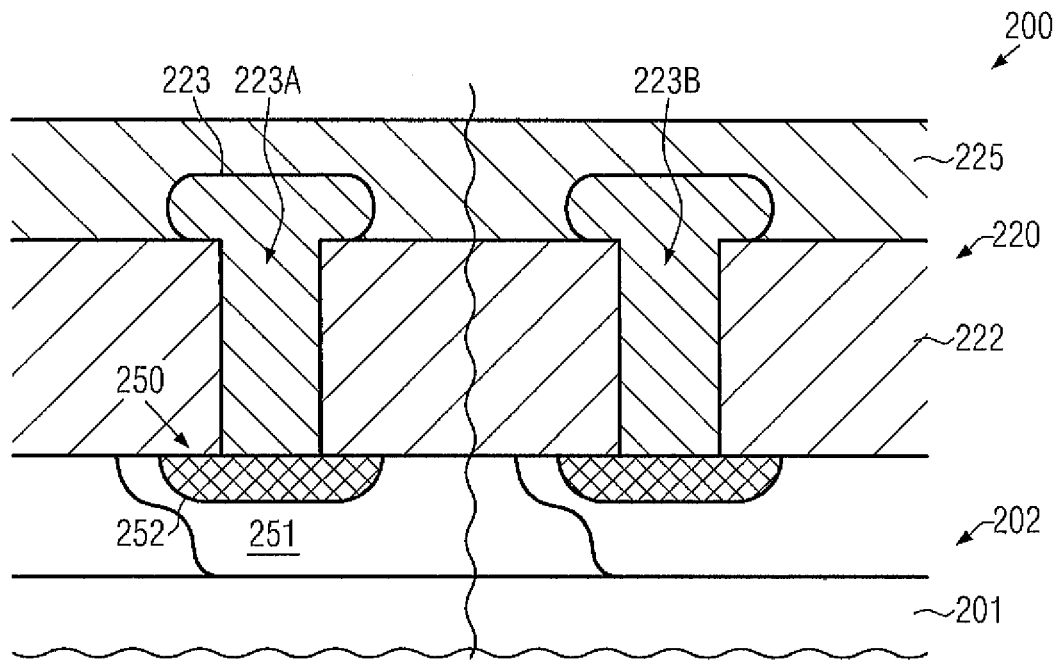
FIGS. 2d-2e schematically illustrate cross-sectional views of the semiconductor device according to illustrative embodiments in which the contact elements may be embedded on the basis of a sacrificial fill material so as to reduce undue mechanical stress upon planarizing the contact level.

FIG. 2d schematically illustrates the semiconductor device 200 according to further illustrative embodiments. As shown, the contact level 220 may comprise the contact elements 223 having a substantially "mushroom" like configuration, which may be caused by a certain degree of overfilling of the contact openings 223A, 223B during the selective deposition process, as is for instance also described with reference to the semiconductor device 100. Moreover, a sacrificial material 225, such as a planarization material, may be formed above the contact level 220, such that the contact elements 223 are embedded, i.e., are laterally embedded in the dielectric material 222 of the contact level 220 and in the sacrificial material 225. To this end, after forming the contact elements 223 with a desired degree of overfilling, the material 225 may be deposited, for instance by spin-on techniques and the like, in order to provide a superior planar surface topography. In other cases, the material 225 may be provided by any other deposition technique, in combination with a planarization process, such as a polishing process and the like. Based on the configuration as shown in FIG. 2d, a further planarization process may be applied so as to provide a planar surface topography for the contact level 220.

Figure 2E:
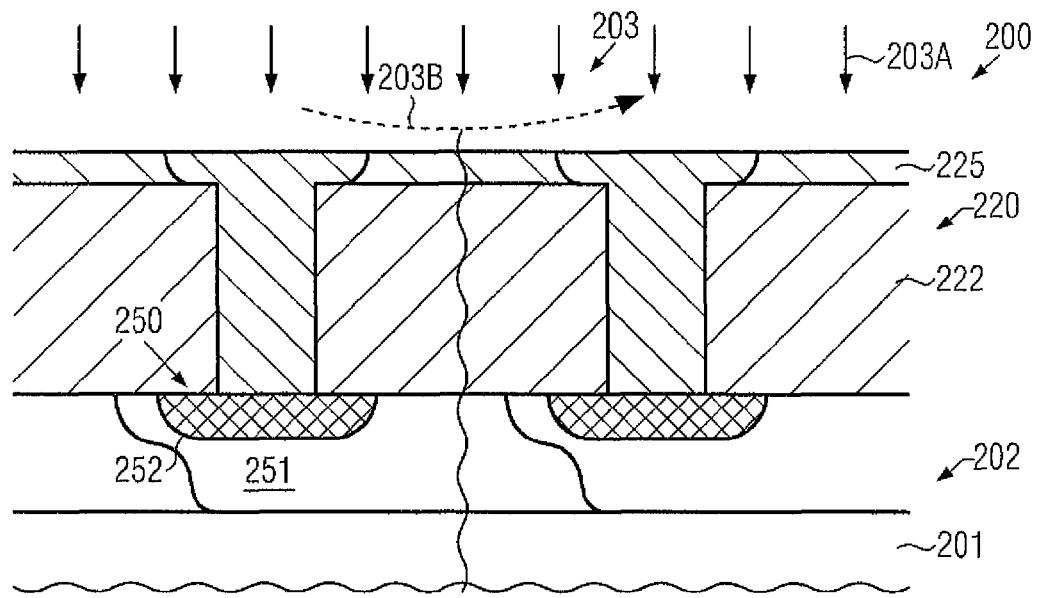

FIG. 2e schematically illustrates the semiconductor device 200 at an intermediate phase of the planarization process 203, which may be performed on the basis of an etch process 203A and/or a polishing process 203B. For example, when applying the etch process 203A, an appropriate etch recipe may be applied, such as a plasma-assisted etch process, a wet chemical etch process, in which the material 225 and the conductive material of the contact elements 223 may have a very similar removal rate. Consequently, in the phase of the etch process 203A as shown in FIG. 2e, the material 225 and the material of the contact elements 223 may be concurrently removed, wherein the corresponding etch process may be controlled on the basis of the material 222, which may act as an efficient etch stop material. In other illustrative embodiments, the polishing process 203B may be performed on the basis of a process recipe, in which substantially the same removal rate may be obtained for the material 225 and the contact elements 223. For example, the characteristics of the sacrificial material 225 may be efficiently adjusted, for instance in terms of hardness and the like, by performing appropriate treatments when providing a polymer material and/or by selecting an appropriate basic material composition when using any other material. For example, the conductive material of the contact elements 223, which may be provided in the form of a homogeneous metal, may have a reduced thickness and thus a polymer material may be appropriate for obtaining a similar removal rate on the basis of a polishing recipe, in which substantially the physical removal mechanism may be dominant. Consequently, any undue sheer forces during the process 203B may be avoided, thereby reducing the probability of creating contact failures, as may be the case in the conventional strategy previously explained. Furthermore, in other illustrative embodiments, a combination of an etch process and a polishing process may be applied.

Figure 2F:
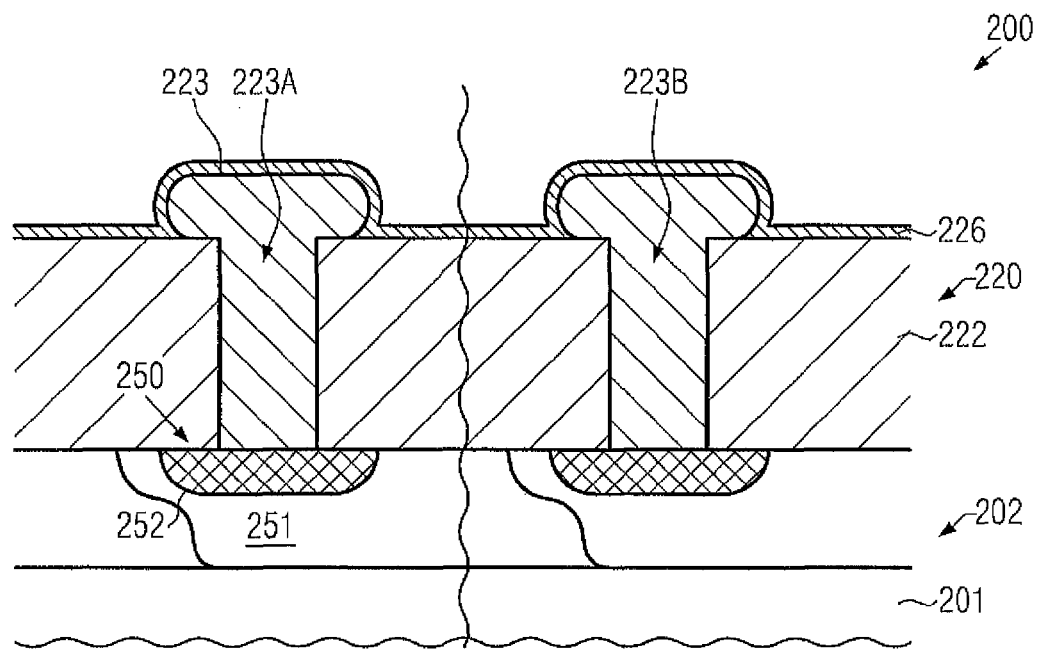
FIGS. 2f-2k schematically illustrate a process strategy for planarizing the contact level of the semiconductor device on the basis of an electrochemical etch process, according to further illustrative embodiments.

FIG. 2f schematically illustrates the semiconductor device 200 according to further illustrative embodiments, in which the contact elements 223 may form a non-continuous material system above the contact level 220, for instance caused by a certain degree of overfilling, as indicated above, wherein, additionally, a sacrificial material 226 may be provided in the form of a continuous conductive material layer. For this purpose, after forming the contact elements 223 on the basis of a selective deposition process, the continuous conductive layer 226 may be provided, for instance by applying any appropriate deposition technique, such as CVD, sputter deposition and the like so that contact elements 223 are "embedded" by means of the dielectric material 222 and the conductive material layer 226. The conductive material layer 226 may be comprised of any appropriate conductive material, such as a metal layer and the like, which may act as a current distribution layer for a removal process performed on the basis of an electrochemical mechanism.

Figure 2G:
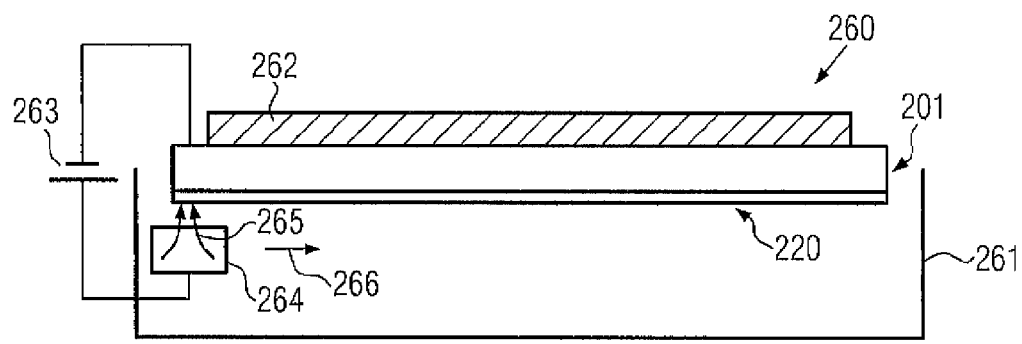

FIG. 2g schematically illustrates a electrochemical etch system 260, which may be configured to receive the substrate 201 in order to perform an electrochemical planarization process on the contact level 220 comprising the conductive sacrificial layer 226 as shown in FIG. 2f. The system 260 may comprise a support system 262 that is configured to receive the substrate 201, wherein, in the embodiment shown, the surface to be treated, i.e., the contact level 220, may be provided within a reactor or vessel 261. Furthermore, the system 260 may comprise an electrode assembly 264, which may represent a movable electrode assembly, which may be scanned across the substrate 201, thereby forming a movable gap between the surface to be treated, i.e., the contact level 220, and the moving electrode assembly 264. Moreover, the electrode assembly 264 may be appropriate configured so as to provide one or more jets of appropriate fluids, as indicated by 265, for instance for providing an electrolyte solution or any other appropriate process fluid required for initiating an electrochemical material removal process. For example, the electrolyte 265 may contain a mixture of an inert solvent and a conducting salt of a non-oxidizing acid. Furthermore, a power source 263 may be provided so as to enable the application of voltage and thus current pulses between the surface 220, which may act as an anode, and the movable electrode assembly 264, which may act as a cathode. Consequently, upon initiating an appropriate voltage or a sequence of voltage pulses, a current flow may be established between the surface to be treated, i.e., the contact level 220 comprising the conductive layer 226 and the excess material of the contact elements 223 (FIG. 2f) and the movable electrode assembly 264 via the process fluid 265. Based on the corresponding scan speed, the sequence of voltage pulses, the composition of the electrolyte solution or generally the process fluid 265, an efficient material removal of the layer 226 and the excess material of the contact elements 223 may be initiated, wherein preferably a material removal may be obtained for portions having an increased thickness of metal formed above the contact level 220. Consequently, during the electrochemical etch process, the overall surface topography may be increasingly planarized, for instance by scanning across the substrate 201 several times, for instance by using different process conditions, such as pulse sequences, scan speeds and the like.

Figures 2H, 2I:
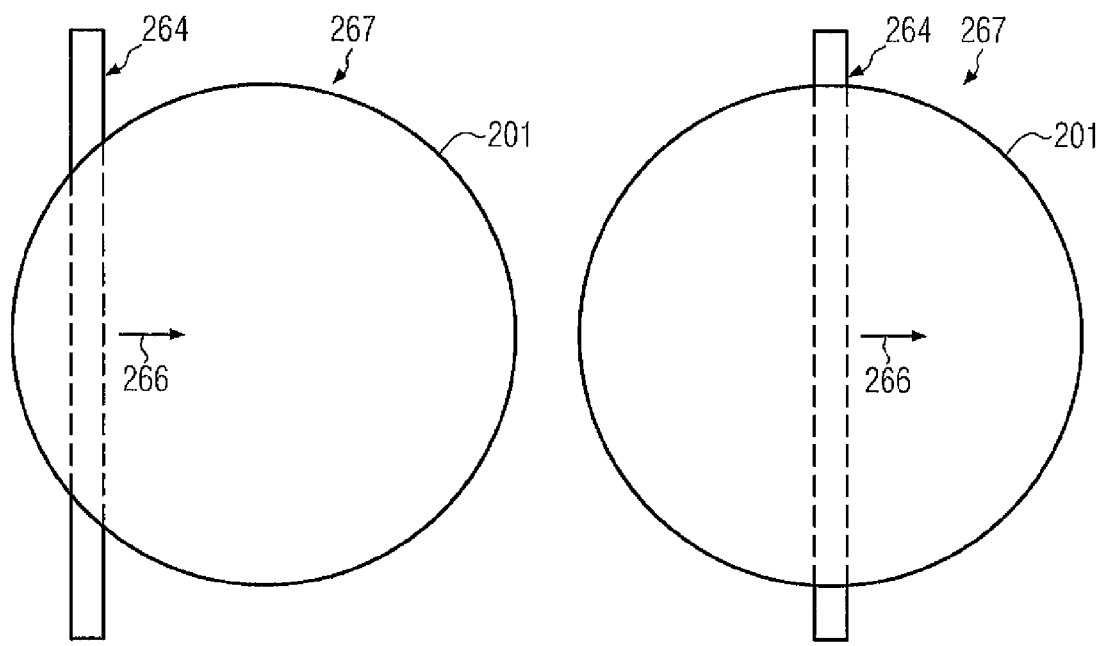

FIG. 2h schematically illustrates the substrate 201 during a certain phase of an electrochemical etch process 267, wherein the movable electrode assembly 264 may be moved along a scan direction 266 on the basis of process parameters, such as voltage and shape and frequency of pulses, scan speed along the direction 266 and the like.

FIG. 2i schematically illustrates the substrate 201 in a further advanced stage of the electrochemical etch process 267, wherein the movable electrode assembly 264 may be positioned at approximately the center of the substrate 201. Consequently, by scanning across the substrate 201 one or several times, any excess material of the contact elements 223 and the sacrificial conductive material layer 226 (FIG. 2f) may be removed, thereby resulting in a substantially planar surface topography. It should be appreciated that appropriate process parameters may be readily established on the basis of experiments by performing electrochemical etch processes on the basis of different process parameter settings and observing the removal behavior and the planarization effect of the various parameter settings.

Figure 2J:
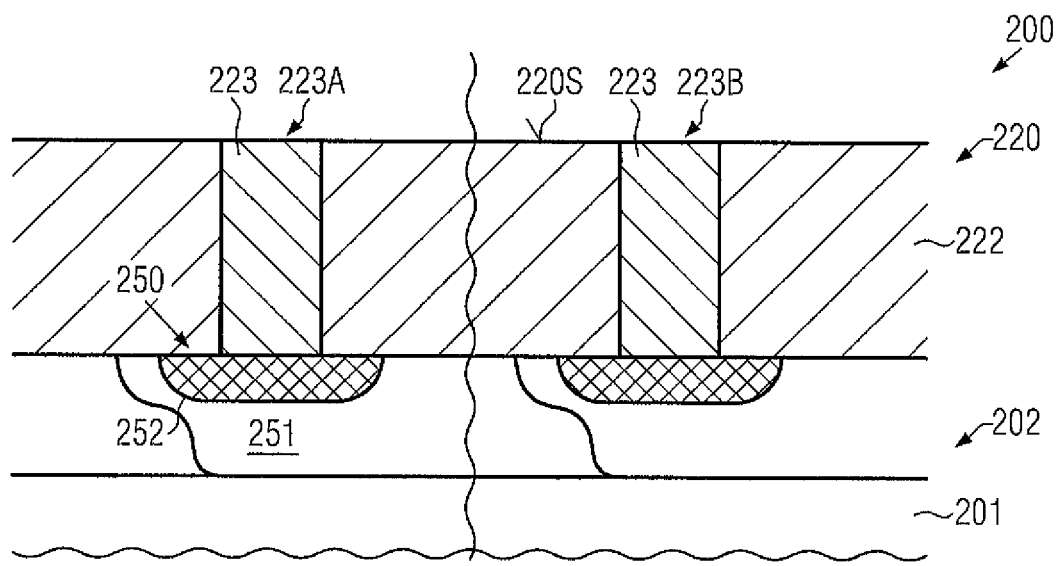

FIG. 2j schematically illustrates the semiconductor device 200 with a planar surface topography, as indicated by 220S. Consequently, also in this case, the contact elements 223 may be provided with a desired planar configuration without exerting any undue mechanical stress to the contact elements 223.

Figure 2K:
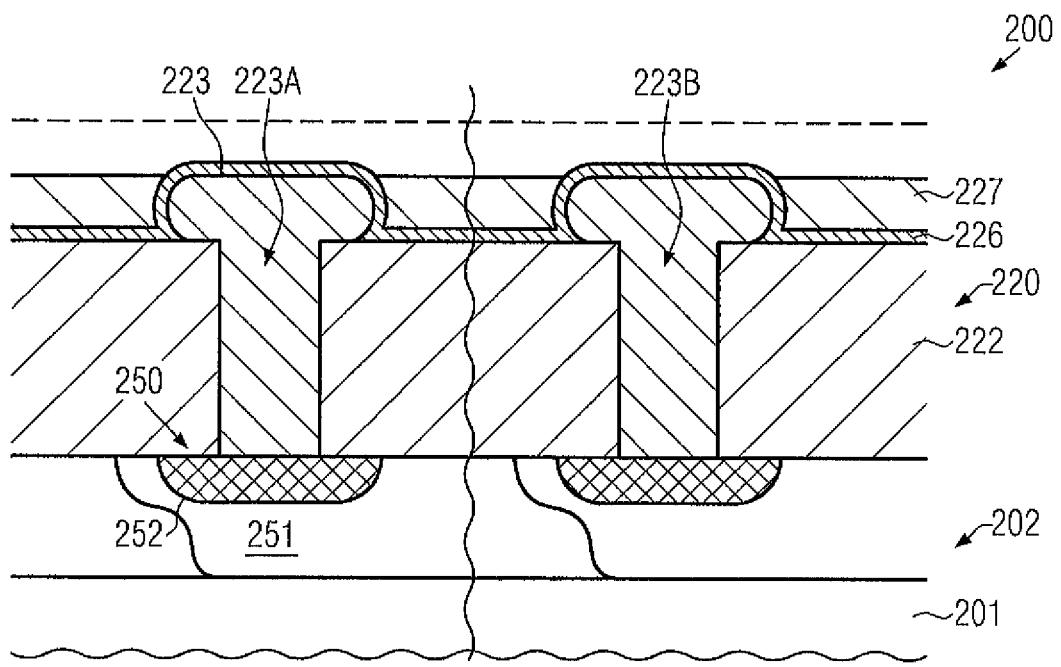

FIG. 2k schematically illustrates the semiconductor device 200 according to further illustrative embodiments, in which a further sacrificial material 227 may be formed above the conductive material layer 226. The further sacrificial material 227 may be provided in the form of a planarization material, such as a polymer material, and may be etched back after application, so as to cover the material 226 at surface portions of the contact level 220 outside of the contact elements 223, which may be advantageous when performing the wet chemical etch process 267, as described above. That is, the electrochemical etch process may be initiated on the basis of any appropriate process parameters, wherein a initial material removal of the layer 226 may be suppressed due to the presence of the additional sacrificial material 227. Consequently, in a corresponding phase of the electrochemical etch process, exposed portions of the material layer 226 and the excess material of the contact elements 223 may be preferably removed, thereby further enhancing the planarizing effect of the electrochemical etch process. The wet chemical etch process may have a substantially self-limiting behavior in that the conductive material around the contact elements 223 may be removed so as to finally interrupt the continuous layer 226 around the contact elements 223. Thereafter, the layer 227 may be removed, for instance by wet chemical etch techniques, plasma-enhanced etch processes, followed by the removal of the remaining portions of the layer 226, which may be accomplished by wet chemical etch processes, CMP and the like. In other cases, the wet chemical etch process may be interrupted so as to remove the material 227, after a certain degree of planarization has been achieved, and thereafter the wet chemical etch process may be continued in order to remove the remaining material 226 and any undesired excess material of the contact elements 223, however, on the basis of less sophisticated process conditions with respect to a height difference between the layer 226 and the contact elements 223.

As a result, the present disclosure provides process strategies in which contact elements may be formed on the basis of selective deposition techniques, such as electroless plating, wherein the subsequent planarization of the contact level may be accomplished without inducing undue mechanical stress in the contact element. To this end, in some illustrative embodiments, an appropriate embedding of the contact metal of the contact elements may be achieved, for instance by reliably avoiding an overfilling of the corresponding contact openings and/or by providing a sacrificial material, which may preserve integrity of the contact elements on performing a planarization process, for instance in the form of an etch process, a polishing process or a combination thereof. In still further illustrative embodiments, the removal of any excess material of the contact elements may be accomplished on the basis of electrochemical etch processes, wherein a sacrificial conductive layer may be used as a current distribution layer. Consequently, the further processing may then be continued on the basis of a planar surface topography of the contact level and thus the very first metallization layer of a metallization system may then be formed so as to appropriately connect to the contact elements in the contact level, which may have a superior conductivity due to the selective deposition technique used for forming the metal of the contact elements.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a contact element in a semiconductor device, the method comprising:
   forming a metal in a contact opening formed in a dielectric material of a contact level by performing a selective deposition process, said contact opening connecting to a contact area of a circuit element formed at least partially in a semiconductor layer of said semiconductor device, wherein an upper surface of said dielectric material defines a first height level, wherein performing said selective deposition process comprises depositing said metal in said contact opening without depositing said metal above said upper surface of said dielectric material;
   forming a contact element from said metal by partially filling said contact opening with said metal, wherein an upper surface of said metal partially filling said contact opening defines a second height level that is below said first height level; and
   performing a planarization process to remove an upper portion of said dielectric material until a planarized surface of said dielectric material is lowered to at least said second height level.

2. The method of claim 1, wherein performing said planarization process comprises performing a chemical mechanical polishing process so as to remove a portion of said dielectric material.

3. The method of claim 1, further comprising forming a sacrificial fill material in an unfilled portion of said contact opening and above said dielectric material after forming said metal and prior to performing said planarization process.

4. The method of claim 3, wherein performing said planarization process comprises performing at least one of an etch process and a polishing process.

5. The method of claim 1, wherein performing said selective deposition process comprises performing an electroless plating process and using said contact area as a catalyst material.

6. A method, comprising:
   forming a contact opening in a dielectric material of a contact level of a semiconductor device;
   forming a conductive material selectively within said contact opening, wherein an upper surface of said conductive material is below an upper surface of said dielectric material, and wherein forming said conductive material selectively within said contact opening comprises depositing said conductive material in said contact opening without depositing said conductive material above said upper surface of said dielectric material; and
   removing a portion of said dielectric material so as to provide a substantially planar surface topography of said contact level, wherein after removing said portion of said dielectric material, said substantially planar surface of said dielectric material is lowered at least to said upper surface of said conductive material.

7. The method of claim 6, wherein said conductive material is selectively formed in said contact opening by performing an electroless plating process.

8. The method of claim 6, wherein removing a portion of said dielectric material comprises performing a polishing process.

9. The method of claim 8, wherein performing said electroless plating process comprises depositing a metal directly on a contact area formed in a semiconductor region.

10. The method of claim 6, further comprising forming a sacrificial planarization material above said conductive material prior to removing said portion of said dielectric material.

11. The method of claim 10, wherein removing said portion of said dielectric material comprises performing at least one of an etch process and a polishing process in the presence of said sacrificial planarization material.

* * * * *